(12) United States Patent
Lai et al.

(10) Patent No.: US 11,264,282 B2
(45) Date of Patent: Mar. 1, 2022

(54) GATE FORMATION PROCESS

(71) Applicant: Taiwan Semiconductor Manufacturing Co., Ltd., Hsin-Chu (TW)

(72) Inventors: Chi-Sheng Lai, Hsinchu (TW); Wei-Chung Sun, Hsinchu (TW); Li-Ting Chen, Hsinchu (TW); Kuei-Yu Kao, Hsinchu (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 124 days.

(21) Appl. No.: 16/800,871

(22) Filed: Feb. 25, 2020

(65) Prior Publication Data
US 2021/0265219 A1  Aug. 26, 2021

(51) Int. Cl.
*H01L 21/8234* (2006.01)
*H01L 21/308* (2006.01)
*H01L 21/3213* (2006.01)
*H01L 21/033* (2006.01)

(52) U.S. Cl.
CPC .. *H01L 21/823431* (2013.01); *H01L 21/0337* (2013.01); *H01L 21/3086* (2013.01); *H01L 21/32137* (2013.01); *H01L 21/32139* (2013.01); *H01L 21/823437* (2013.01)

(58) Field of Classification Search
CPC .......................... H01L 21/3086; H01L 21/0337
See application file for complete search history.

(56) References Cited

U.S. PATENT DOCUMENTS

| | | |
|---|---|---|
| 8,716,841 B1 | 5/2014 | Chang et al. |
| 8,736,084 B2 | 5/2014 | Cheng et al. |
| 8,796,666 B1 | 8/2014 | Huang et al. |
| 8,837,810 B2 | 9/2014 | Chen et al. |
| 9,093,530 B2 | 7/2015 | Huang et al. |
| 9,134,633 B2 | 9/2015 | Lin et al. |
| 9,230,867 B2 | 1/2016 | Cheng et al. |
| 9,304,403 B2 | 4/2016 | Lin et al. |

(Continued)

FOREIGN PATENT DOCUMENTS

| | | |
|---|---|---|
| KR | 20120131780 | 12/2012 |
| KR | 20170065729 | 6/2017 |

(Continued)

*Primary Examiner* — Walter H Swanson
(74) *Attorney, Agent, or Firm* — Haynes and Boone, LLP

(57) ABSTRACT

Processes to form differently-pitched gate structures are provided. An example method includes providing a workpiece having a substrate and semiconductor fins spaced apart from one another by an isolation feature, depositing a gate material layer over the workpiece, forming a patterned hard mask over the gate material layer, the patterned hard mask including differently-pitched elongated features, performing a first etch process using the patterned hard mask as an etch mask through the gate material layer to form a trench, performing a second etch process using the patterned hard mask as an etch mask to extend the trench to a top surface of the isolation feature, and performing a third etch process using the patterned hard mask to extend the trench into the isolation feature. The first etch process includes use of carbon tetrafluoride and is free of use of oxygen gas.

20 Claims, 11 Drawing Sheets

(56) References Cited

U.S. PATENT DOCUMENTS

| | | | |
|---|---|---|---|
| 9,404,743 | B2 | 8/2016 | Chiu et al. |
| 9,548,303 | B2 | 7/2017 | Lee et al. |
| 10,079,180 | B1 * | 9/2018 | Sun .................... H01L 21/0223 |
| 2011/0014791 | A1 | 1/2011 | Johnson et al. |
| 2012/0302034 | A1 | 11/2012 | Lee et al. |
| 2017/0162674 | A1 | 6/2017 | Kim et al. |
| 2017/0338326 | A1 | 11/2017 | Ching et al. |
| 2019/0363177 | A1 | 11/2019 | Su et al. |
| 2020/0006557 | A1 | 1/2020 | Ko et al. |

FOREIGN PATENT DOCUMENTS

| | | |
|---|---|---|
| KR | 20180015567 A | 2/2018 |
| KR | 20200002568 | 1/2020 |
| KR | 20200002570 A | 1/2020 |

* cited by examiner

GATE FORMATION PROCESS

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, double-patterning or multiple patterning have been used to form patterning features of uniform dimensions. Mandrels are first formed over a hard mask layer. A spacer layer is then deposited over the mandrels, including over sidewalls of the mandrels. After the spacer layer deposited over the mandrels are removed to expose the mandrels, the mandrels are selectively removed, leaving behind the patterned spacer layers that used to line the sidewalls of the mandrels. The patterned spacer layers functions as an etch mask to pattern the underlying hard mask layer. However, when differently pitched gate structures in a semiconductor device are desirable, etch loading effect may prevent uniform etching throughout the depth of a gate material for the gate structures. Several conventional processes have been proposed to address this challenge but none of them are satisfactory in all aspects. An improved process is therefore desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
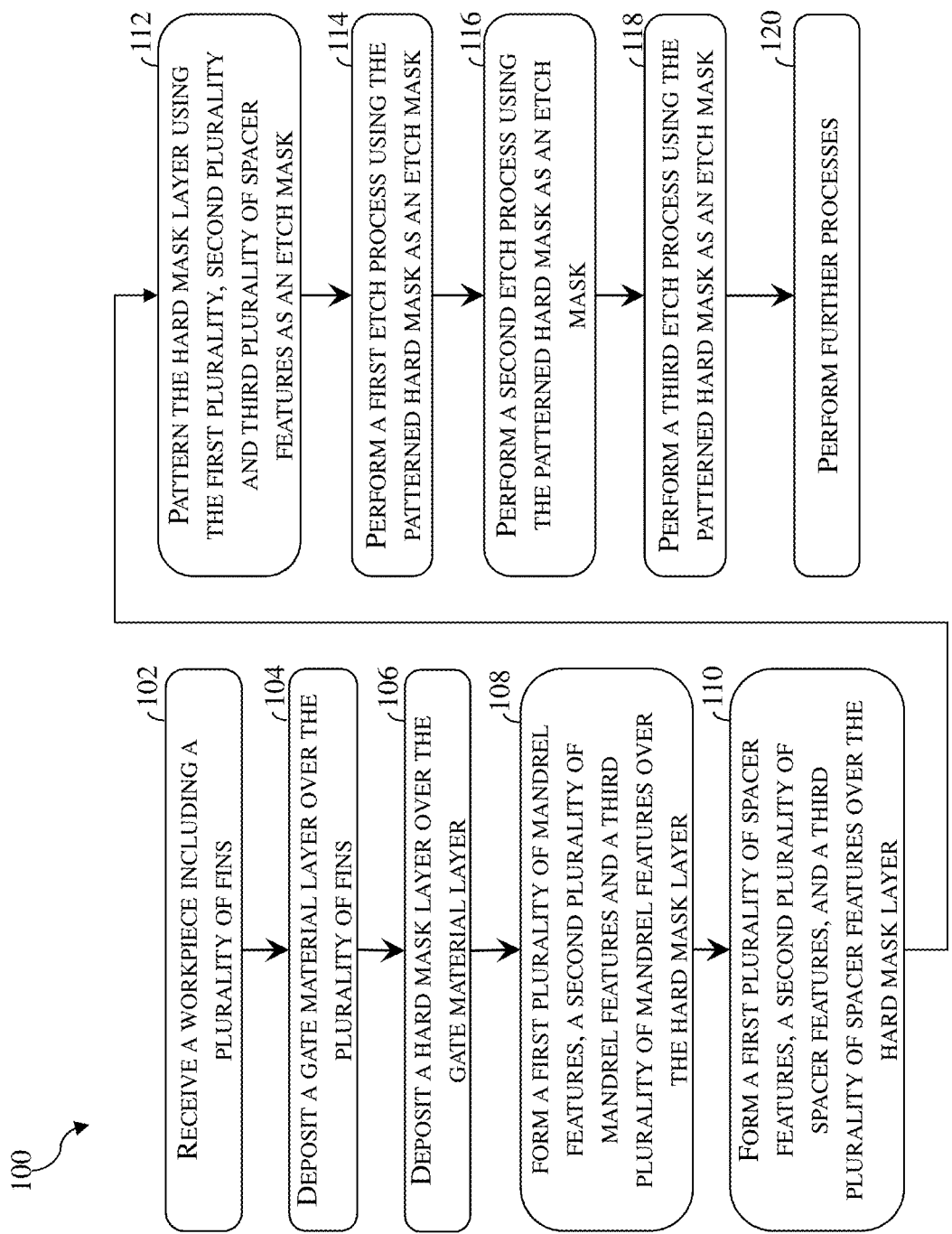
FIG. 1 is a flow chart of a method for fabricating a semiconductor device according to various aspects of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Advances in semiconductor fabrication are made to accommodate shrinking dimensions of the semiconductor device features. When the shrinkage of dimensions goes beyond resolution of photolithography, multiple-patterning techniques have been used. For example, a double patterning lithography (DPL) process (e.g., a lithography-etch-lithography-etch (LELE) process, a self-aligned double patterning (SADP) process, a spacer-is-dielectric patterning (SIDP) process, other double patterning process, or combinations thereof) may be used to form a patterned etch mask. Further iteration of the process steps may be performed to form features of even smaller sizes. For instance, a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof may be implemented. Generally, multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using, for example, a self-aligned process. Then, the patterned sacrificial layer is removed, and the spacers can be used as an etch mask to pattern an underlying layer, such as a hard mask layer.

A limitation of the foregoing multiple-patterning techniques is that the resulting etch mask includes features of a substantially uniform width. This is so because these features are a result a self-alignment process that happens at a scale beyond the resolution of the photolithography process. While the photolithography process(es) in the multiple-patterning techniques may dictate pitches and spacings among features, it is powerless to vary the dimensions of the self-aligned features. In the example set forth above, as the photolithography process patterns the sacrificial layer, dimensions of the sacrificial layer features in the patterned sacrificial layer may be controlled by the photolithography process. However, the photolithography process does not affect how the spacer is deposited over the sacrificial layer. Instead, the thickness and uniformity of the spacer layer may be largely controlled by material properties of the spacer layer and process parameters, which are uniform across the spacer layer. As a result, dimensions of features in the spacer layer are largely uniform.

This limitation creates challenges when gate structures with varying pitches are desired in a semiconductor device. It has been observed that densely packed features and loosely packed features experience different etch rate due to different etch loading. In one mode of the uneven etch loading, byproducts of an etch process may be redeposited on lateral surfaces in an isolated region (i.e., a loosely packed region) and on lateral surfaces in a dense region (i.e. a densely packed region) at different rates, resulting in uneven lateral etching in different regions. In some instances, the byproduct redeposition rate in an isolated region is greater than that in the dense region and the isolated region etches at a slower rate than the dense region. To compensate for the uneven lateral etching, additional photolithography processes and etch processes may be used to trim the patterned hard mask. In an example where the isolated region etches at a slower rate, the patterned hard mask features in the isolated region is trimmed to have a smaller dimension. However, such additional photolithography processes and trimming processes may involve increased cost and may reduce fabrication throughput. High-resolution photolithography techniques with smaller wavelengths may also be used to precisely form etch mask features with varied dimensions to compensate for the uneven lateral etching. However, use of such high-resolution photolithography techniques also involve increased cost.

The present disclosure provides a process to evenly etches through gate material layer using differently pitched but similarly sized etch mask features, so as to form gate structures with substantially straight sidewalls. An example process includes a first etch process for etching through the gate material layer over a top surface of an active region (e.g., a fin or a semiconductor fin), a second etch process for etching the gate material layer through a top surface of an isolation feature, and a third etch process for etching into the isolation feature. The first etch process includes use of carbon tetrafluoride and is free of oxygen gas ($O_2$). In addition, the first etch process is performed at an increased pressure to reduce lateral etching. The second etch process includes a nitridation process to nitridate a dummy gate dielectric layer so as to protect the active regions. The third etch process is free of oxygen gas ($O_2$) and hydrogen bromide (HBr). Instead, the third etch process includes use of chlorine and lasts for a short period of time. By avoiding using high-cost alternative processes, processes according to the present disclosure present an economic option for forming differently pitched gate structures with substantially perpendicular sidewalls. Put differently, processes of the present disclosure provide circuit designer with more degrees of design freedom without being concerned with much increased fabrication cost.

The various aspects of the present disclosure will now be described in more detail with reference to the figures. FIG. 1 is a flow chart of a method 100 for fabricating a semiconductor device according to various aspects of the present disclosure. In some implementations, the semiconductor device includes multi-gate transistors where a gate structure wraps around multiple sides of an active region in its channel region. Examples of multi-gate transistors include fin-like field effect transistors (FinFETs) or a gate-all-around (GAA) transistors. Method 100 is merely an example and is not intended to limit the present disclosure to what is explicitly illustrated in method 100. Additional steps can be provided before, during, and after method 100, and some of the steps described can be moved, replaced, or eliminated for additional embodiments of method 100. Not all steps are described herein in detail for reasons of simplicity. Method 100 will be described below in conjunction with the perspective view, the top view, and fragmentary cross-sectional views of a workpiece 200 shown in FIGS. 2, 3A, 3B, and 4-11. Because a semiconductor device will be formed from the workpiece 200, the workpiece 200 may be referred to as semiconductor device 200 as the context requires.

The semiconductor device 200 may be included in a microprocessor, a memory, and/or other integrated circuit (IC) device. In some implementations, the semiconductor device 200 may be a portion of an IC chip, a system on chip (SoC), or portion thereof, that includes various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Illustrations of the semiconductor device 200 in FIGS. 2, 3A, 3B, and 4-11 have been simplified for the sake of clarity to better understand the inventive concepts of the present disclosure. Additional features can be added in semiconductor device 200, and some of the features described below can be replaced, modified, or eliminated in other embodiments of semiconductor device 200.

Figure 2:
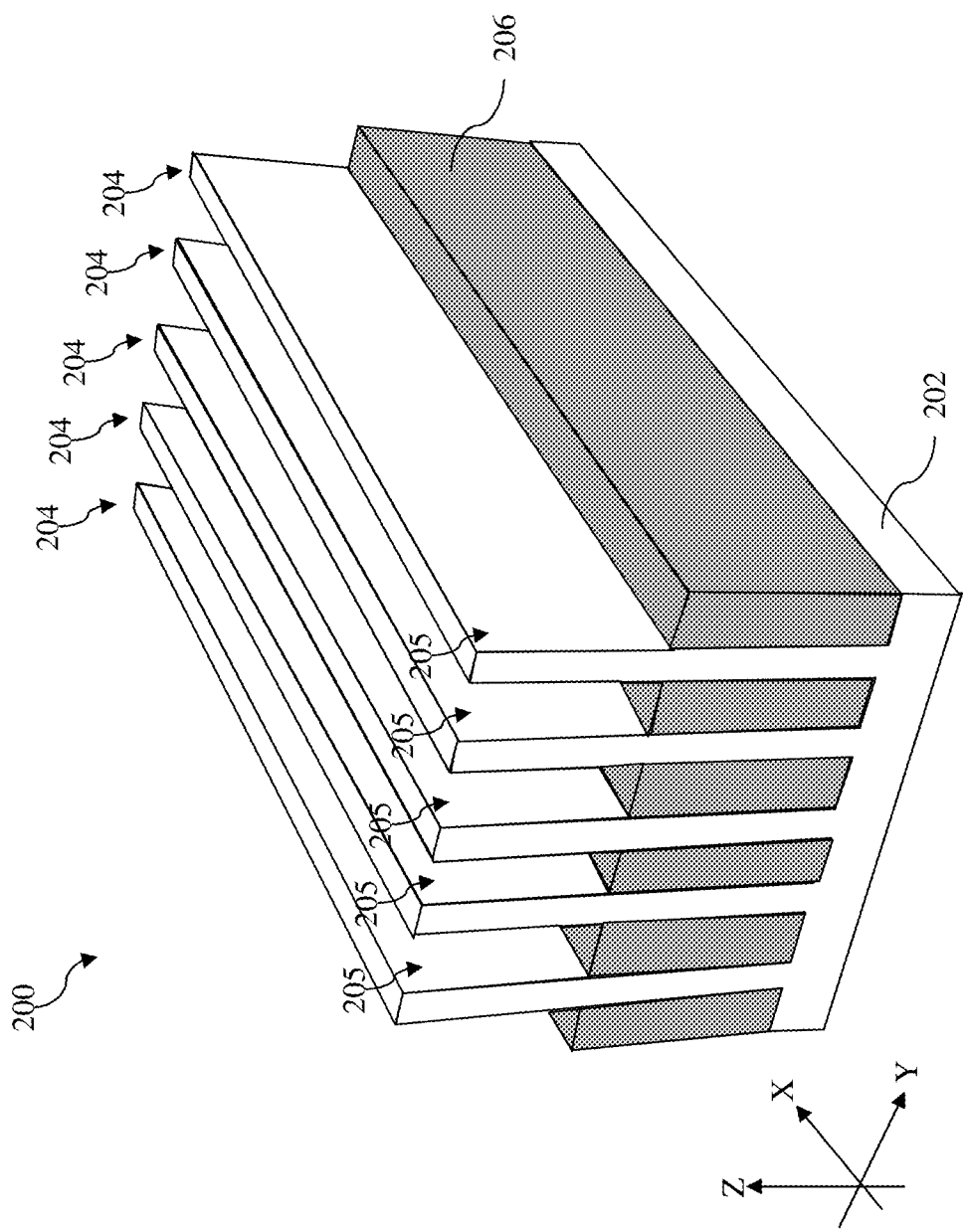
FIG. 2 is a perspective schematic view of a workpiece for a semiconductor device, according to various aspects of the present disclosure.
Figure 3A:
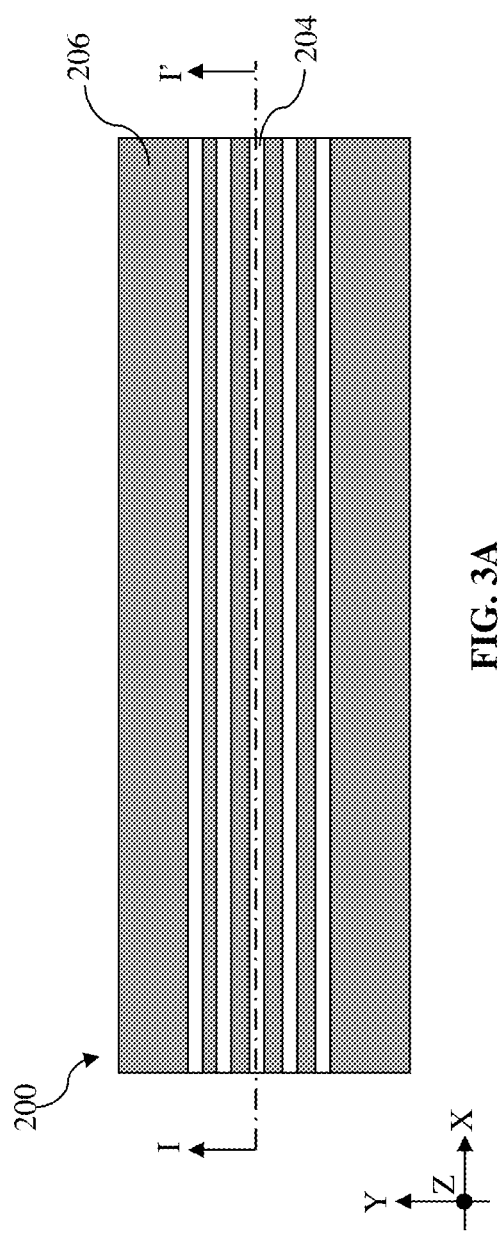
FIG. 3A is a fragmentary schematic top view of a workpiece at one of the fabrication stages, such as those associated with the method in FIG. 1, according to various aspects of the present disclosure.
Figure 3B:
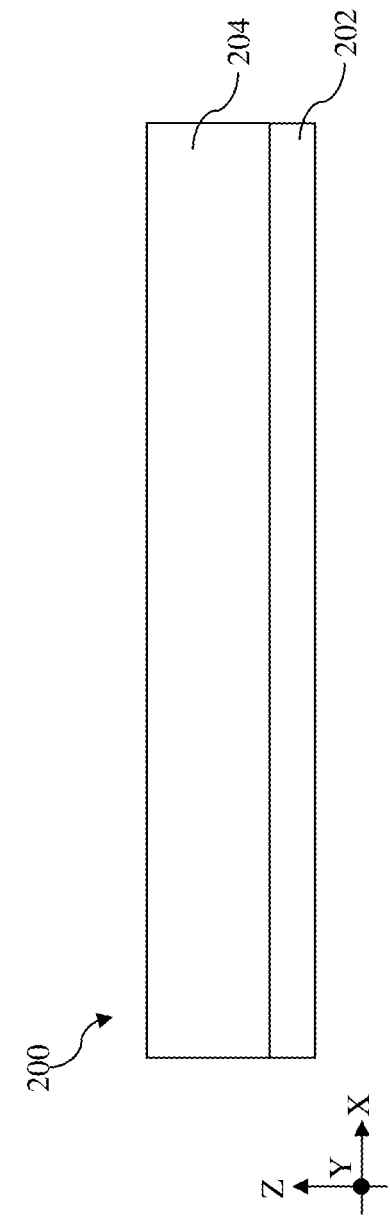
FIGS. 3B and 4-11 are fragmentary schematic cross-sectional view of a workpiece at various fabrication stages, such as those associated with the method in FIG. 1, according to various aspects of the present disclosure.

Referring to FIGS. 1, 2, 3A, and 3B, method 100 includes a block 102 where a workpiece 200 including a plurality of fins 204 is received. As shown in FIGS. 2, 3A and 3B, the workpiece 200 includes a substrate 202. In the depicted embodiment, substrate 202 is a bulk substrate that includes silicon. Alternatively, in some implementations, substrate 202 includes a bulk substrate (including, for example, silicon) and one or more material layers disposed over the bulk substrate. For example, the one or more material layers can include a semiconductor layer stack having various semiconductor layers (such as a heterostructure) disposed over the bulk substrate, where the semiconductor layer stack is subsequently patterned to form fins. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b$ from bottom to top, where a, c are different atomic percentages of silicon and b, d are different atomic percentages of germanium). Alternatively or additionally, the bulk substrate 202 and/or the one or more material layers include another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-V materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the plurality of fins 204 may be formed from the substrate 202 or semiconductor layers deposited over the substrate 202 using a multiple-patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using, for example, a self-aligned process. Then, the patterned sacrificial layer is removed, and the spacers can be used to pattern an underlying layer. In some implementations, directed self-assembly (DSA) techniques are implemented during the multiple patterning processes. Because each of the plurality of fins 204 is formed of a semiconductor material that forms the substrate 202 or semiconductor layers deposited over the substrate 202, it may also be referred to as a semiconductor fin or semiconductor fin structure. Detailed descriptions of the formation processes of the plurality of fins 204 are omitted for brevity.

Reference is made to FIG. 2, which is a perspective schematic view of the workpiece 200 that includes the plurality of fins 204. The fins 204 extend upward along the Z direction from the substrate 202 and extend in parallel with one another along the X direction. Five fins are shown in FIG. 2 of the present disclosure as an example. The present disclosure is not so limited and fully contemplates workpieces that include more or less fins 204. An isolation feature 206 (i.e., a shallow trench isolation (STI) feature) is formed between adjacent fins 204 to provide electrical isolation and mechanical support. The isolation feature 206 thus includes an isolation material, such as silicon oxide, silicon nitride, silicon oxynitride, other suitable isolation material (for example, including silicon, oxygen, nitrogen, carbon, and/or other suitable isolation constituent), or combinations thereof. As shown in FIG. 2, the isolation feature 206 is pulled-back to form inter-fin recesses 205 such that a portion of each of the plurality of fins rises above a top surface of the isolation feature 206. As similarly shown in a top view illustrated in FIG. 3A, the plurality of fins 204 extend along the X direction and are each separated from adjacent fins by the isolation feature 206. A Y-direction view along the cross section I-I' along one of the plurality of fins 204 is provided in FIG. 3B. Because the cross section goes through the one of the plurality of fins 204, the isolation feature 206 is not visible in FIG. 3B. To illustrate various features of the present disclosure, subsequent figures, including FIGS. 4-11 are fragmentary cross-sectional views across section I-I' through a fin 204 of the workpiece 200, just like FIG. 3B.

Figure 4:
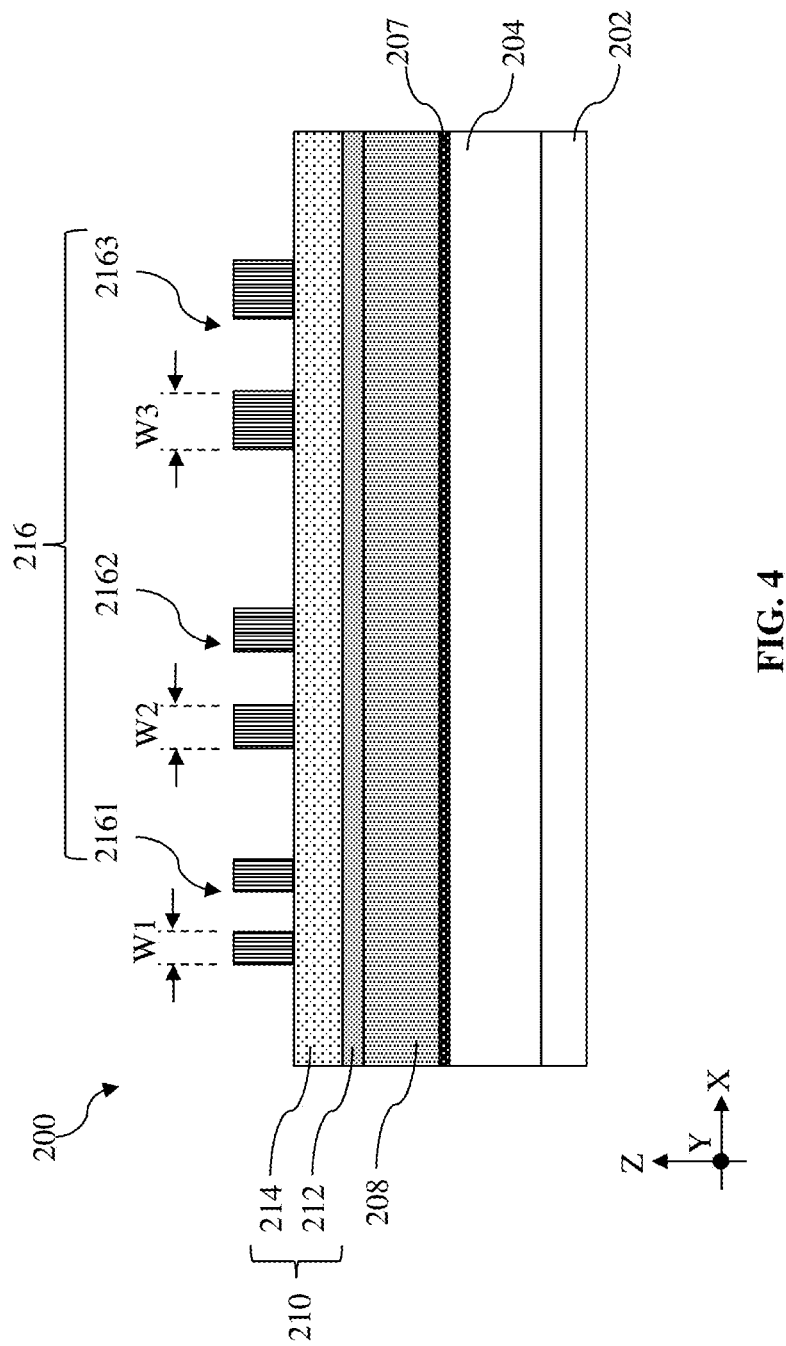

Referring to FIGS. 1 and 4, method 100 includes a block 104 where a gate material layer 208 is deposited over the plurality of fins 204. As shown in FIG. 4, the gate material layer 208 is deposited over the workpiece 200, including over the top surface of the isolation feature 206, the top surface of each of the plurality of fins 204, and into inter-fin recesses 205 (shown in FIG. 2, but not shown in FIG. 4). In some embodiments where a gate-last process or a gate replacement process is adopted, the gate material layer 208 is intended for the formation of dummy gate stacks and may include polysilicon. Dummy gate structures serve as placeholders for functional gate structures through a portion of the fabrication processes and are replaced by the functional gate stack at a later point. A dummy gate dielectric layer 207 may be blanketly deposited over the workpiece 200 before the deposition of the gate material layer 208. As shown in FIG. 4, along the cross-section I-I', the dummy gate dielectric layer 207 is disposed between the top surface of the fin 204 and the gate material layer 208. The dummy gate dielectric layer 207 is also disposed over sidewalls of the plurality of fins 204. In some implementations, the dummy gate dielectric layer 207 may include silicon oxide that is deposited using thermal oxidation or a suitable process.

Referring still to FIGS. 1 and 4, method 100 includes a block 106 where a hard mask layer 210 is deposited over the gate material layer 208. In some embodiments, the hard mask layer 210 is to be patterned to form a patterned hard mask layer 210 to serve as an etch mask to pattern the gate material layer 208. In some implementations not shown, the hard mask layer 210 may be single layer that is formed of silicon oxide, silicon nitride, silicon oxynitride, silicon carbide, silicon oxycarbide, silicon oxycarbonitride, or a suitable dielectric material. In some alternative embodiments shown in FIG. 4, the hard mask layer 210 may be a multi-layer. As illustrated in FIG. 4, the hard mask layer 210 includes a first hard mask layer 212 and a second hard mask layer 214. In some implementations, the first hard mask layer 212 is formed of silicon oxide and the second hard mask layer is formed of a nitrogen containing dielectric material, such as silicon nitride or silicon oxynitride. Each of the first hard mask layer 212 and the second hard mask layer 214 may be deposited using chemical vapor deposition (CVD), low pressure CVD (LPCVD), plasma enhanced CVD (PECVD), other suitable process, or combinations thereof.

Referring to FIGS. 1 and 4, method 100 includes a block 108 where mandrel features 216 (including a first plurality of mandrel features 2161, a second plurality of mandrel features 2162, and a third plurality of mandrel features 2163) are formed over the hard mask layer 210. Each of the first plurality of mandrel features 2161 has a first width W1 along the X direction. Each of the second plurality of mandrel features 2162 has a second width W2 along the X direction. Each of the third plurality of mandrel features 2163 has a third width W3 along the X direction. The third width W3 is greater than the second width W2 and the second width W2 is greater than the first width W1. In some instances, a ratio of the second width W2 over the first width W1 is between about 1.1 and about 2.0 and a ratio of the third width W3 over the first width W1 is between about 1.1 and about 2.0. It is noted that while the first plurality of mandrel features 2161, the second plurality of mandrel features 2162, and the third plurality of mandrel features 2163 are shown in FIG. 4 to be adjacent to one another on the workpiece 200, the present disclosure is not so limited and FIG. 4 merely serves to representatively show that mandrel features of varied widths may be formed in different regions of the same workpiece 200.

The mandrel features 216 may be formed in the following example process. A sacrificial layer is deposited over the hard mask layer 210 by spin-on coating, chemical vapor deposition (CVD), or a suitable deposition process. The sacrificial layer may be formed of a material that has an etching selectivity different than that of the hard mask layer 210 or the spacer layer (218, shown in FIG. 5) such that the sacrificial layer may be patterned or removed without damaging the hard mask layer 210 and the spacer layer. In some implementations, the sacrificial layer may be a suitable semiconductor material (such as silicon, germanium, or amorphous silicon), a dielectric material (such as silicon oxide, silicon nitride, silicon oxynitride, silicon carbide), other suitable material, or combinations thereof. The sacrificial layer is then patterned to form the mandrel features 216. The sacrificial layer is patterned using a photolithography process. A photoresist layer is deposited over the sacrificial layer using spin-on coating and then the photoresist layer is baked in a pre-exposure baking process. The photoresist layer may be a single layer or a multi-layer, such as a tri-layer. The pre-baked photoresist layer is then exposed to a radiation reflected from or transmitting through a photomask with a pattern. The exposed photoresist layer is then baked in a post-exposure baking process and developed in a developing process. The radiation source may be an excimer laser light source, an ultraviolet (UV) source, a deep UV (DUV) source, or an extreme UV (EUV) source. Because the photoresist layer is selected to be sensitive to the radiation, exposed (or non-exposed) portions of the photoresist layer undergo chemical changes to become soluble in a developer solution during the developing process. The resultant patterned photoresist layer carries a pattern that corresponds to that of the mask. The patterned photoresist layer can then be used as an etch mask during an etching process to remove portions of the underlying sacrificial layer. The etching process can include a dry etching process (for example, a reactive ion etching (RIE) process), a wet etching process, other suitable etching process, or combinations thereof. After the etching process, the patterned photoresist layer can be removed by ashing or a suitable method. Alternatively, the exposure process can implement maskless lithography, electron-beam writing, ion-beam writing and/or nanoprint technology. As shown in FIG. 4, the mandrel features 216 are allowed to have different widths along the X direction because they are formed by photolithography processes.

Figure 5:
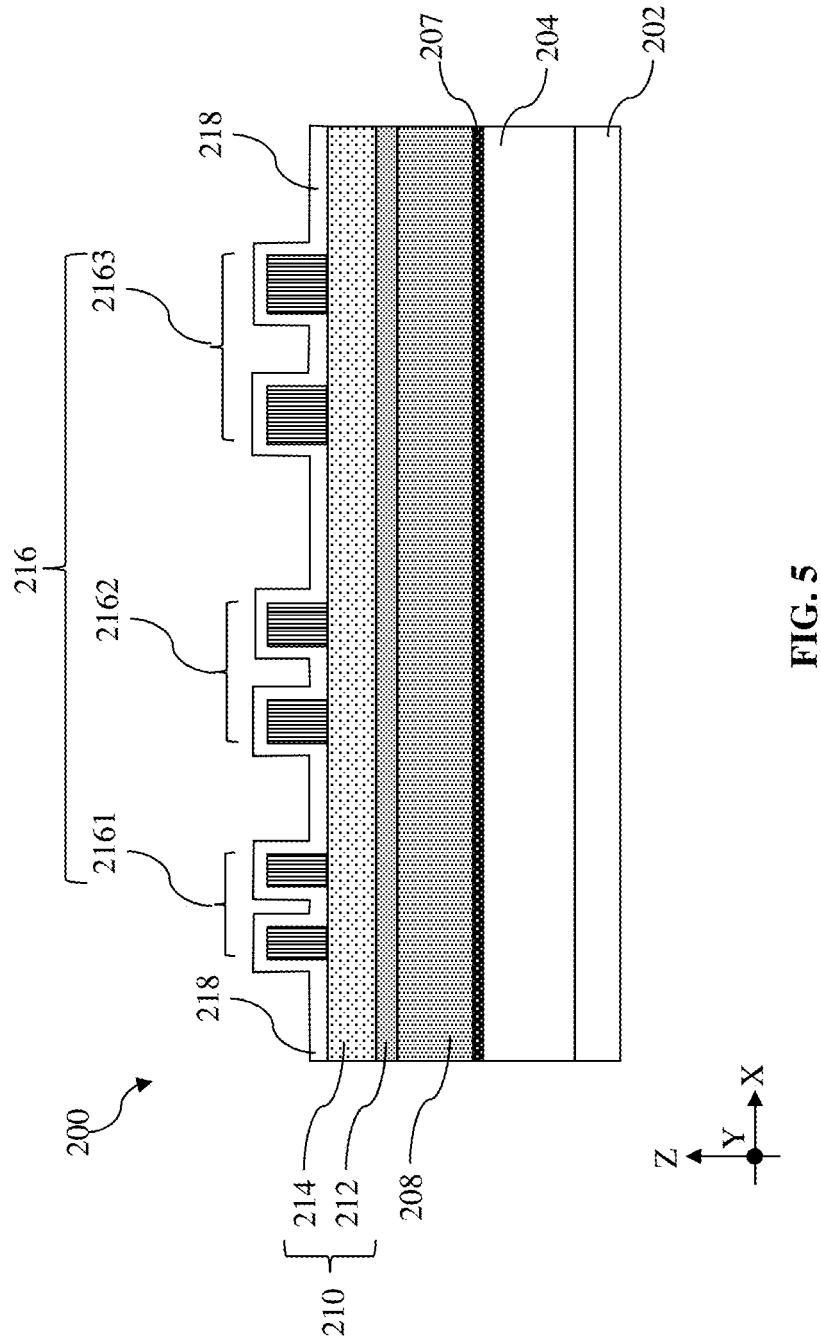
Figure 6:
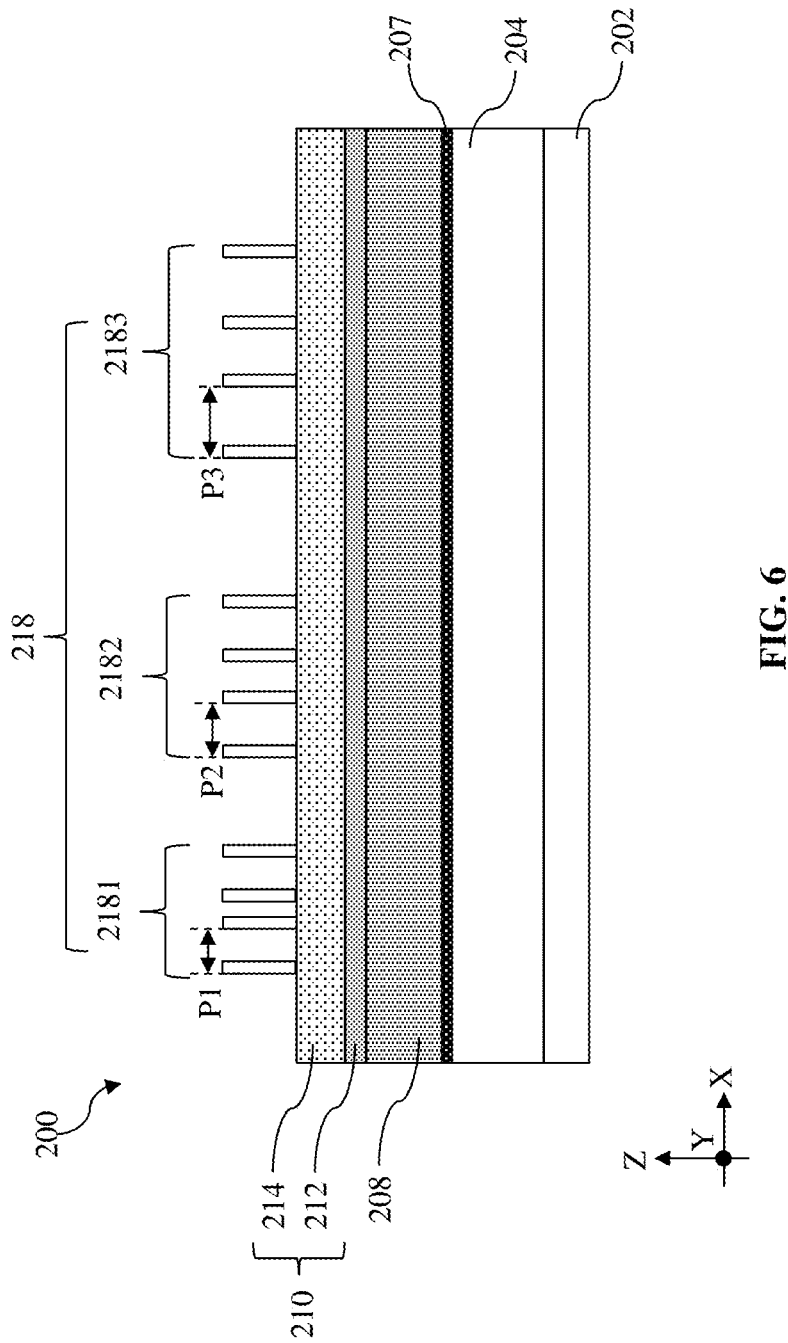

Referring to FIGS. 1, 5 and 6, method 100 includes a block 110 where a first plurality of spacer features 2181, a second plurality of spacer features 2182, and a third plurality of spacer features 2183 are formed over the hard mask layer 210. In some embodiments represented in FIG. 5, a spacer layer 218 is conformally deposited over the workpiece 200, including over top surfaces and sidewalls of the mandrel features 216 using spin-on coating, chemical vapor deposition (CVD), or a suitable deposition process. The spacer layer 218 may be formed of a material that has an etching selectivity different than that of the mandrel features 216 such that the mandrel features 216 may be selectively removed without damaging the spacer layer 218. At the same time, the material for the spacer layer 218 may be selected to have an etching selectivity different than that of the hard mask layer 210 such that the spacer features formed from the spacer layer 218 may be used as an etch mask for the hard mask layer 210. In some implementations, the spacer layer 218 may be a suitable semiconductor material (such as silicon, germanium, or amorphous silicon), a dielectric material (such as silicon oxide, silicon nitride, silicon oxynitride, silicon carbide), other suitable material, or combinations thereof.

Referring now to FIG. 6, after the spacer layer 218 is deposited, an anisotropic etch back process may be performed to remove excess spacer layer 218 on the hard mask layer 210 and on the top surface of the mandrel features 216. The etch back process is performed such that the mandrel features 216 are exposed from spacer layer portions extending along sidewalls of the mandrel features 216. The mandrel features 216 are then selectively removed, leaving behind the patterned spacer layer 218 that include a first plurality of spacer features 2181, a second plurality of spacer features 2182, and a third plurality of spacer features 2183. In some embodiments represented in FIG. 6, the first plurality of spacer features 2181 may be characterized by a first pitch P1, the second plurality of spacer features 2182 may be characterized by a second pitch P2, and the third plurality of spacer features 2183 may be characterized by a third pitch P3. As can be seen from FIGS. 4-6, the first pitch P1 substantially corresponds to the first width W1, the second pitch P2 substantially corresponds to the second width W2, and the third pitch P3 substantially corresponds to the third width W3. In some instances, the first pitch P1 is substantially equal to the first width W1 and the thickness of the spacer layer 218; the second pitch P2 is substantially equal to the second width W2 and the thickness of the spacer layer 218; and the third pitch P3 is substantially equal to the third width W3 and the thickness of the spacer layer 218. In some implementations, a ratio of the second pitch P2 over the first pitch P1 is between about 1.1 and about 2.0 and a ratio of the third pitch P3 over the first pitch P1 is between about 1.1 and about 2.0. While the second pitch P2 and the third pitch P3 share the same ranges, the third pitch P3 is greater than the second pitch P2 in the illustrated embodiments. The difference between the first pitch P1 and the second pitch P2 or the third pitch P3 is at least about 10% to be significant enough such the resultant devices may exhibit different properties or functions. At the same time, the second pitch P2 or the third pitch P3 is less than about twice of the first pitch P1 such that the device density does not suffer due to the enlarged pitches.

Figure 7:
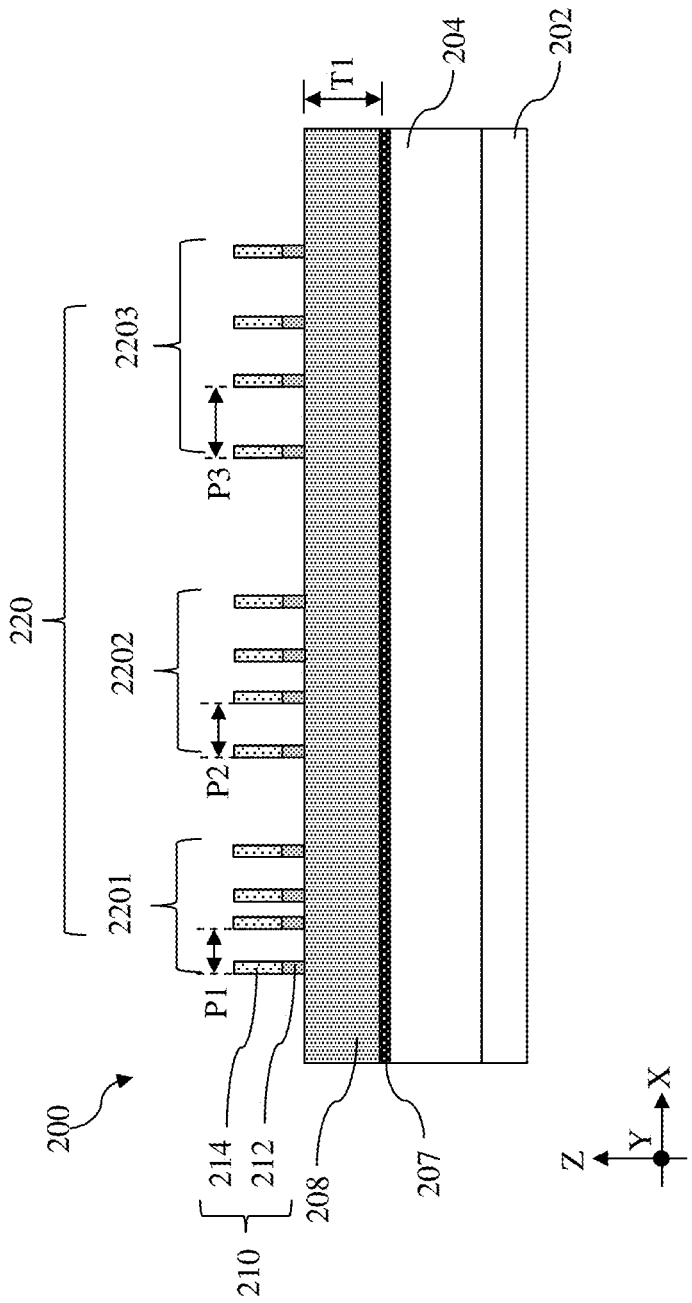

Referring to FIGS. 1 and 7, method 100 includes a block 112 where the hard mask layer 210 is patterned using the first plurality of spacer features 2181, the second plurality of spacer features 2182, and the third plurality of spacer features 2183 as an etch mask. In some embodiments, the hard mask layer 210, including the first hard mask layer 212 and the second hard mask layer 214, may be etched using a dry etch process, a wet etch process, or a suitable process through the first plurality of spacer features 2181, the second plurality of spacer features 2182, and the third plurality of spacer features 2183. An example dry etch may use a fluorine-containing precursor (for example, $CF_4$, $SF_6$, $NF_3$, $CH_2F_2$, $CHF_3$, and/or $C_2F_6$), an oxygen-containing precursor, a chlorine-containing precursor (for example, $Cl_2$, $CHCl_3$, $CCl_4$, and/or $BCl_3$), a bromine-containing precursor (for example, HBr and/or $CHBR_3$), an iodine-containing precursor, other suitable precursor (which can be used to generate an etchant gas and/or etching plasma), or combinations thereof. An example wet etch process implements an etching solution that includes TMAH, $NH_4OH$, $H_2O_2$, $H_2SO_4$, HF, HCl, other suitable wet etching constituent, or combinations thereof. As shown in FIG. 7, operations at block 112 transfer patterns of the first plurality of spacer features 2181, the second plurality of spacer features 2182, and the third plurality of spacer features 2183 onto the hard mask layer 210, resulting in a patterned hard mask 220, which includes in a first plurality of hard mask features 2201, a second plurality of hard mask features 2202, and the third plurality of hard mask features 2203. Like the first plurality of spacer features 2181, the second plurality of spacer features 2182, and the third plurality of spacer features 2183, the first plurality of hard mask features 2201 includes the first pitch P1, the second plurality of hard mask features 2202 includes the second pitch P2, and the third plurality of hard mask features 2203 includes the third pitch P3. As shown in FIG. 7, the gate material layer 208 underlying the first plurality of hard mask features 2201, the second plurality of hard mask features 2202, and the third plurality of hard mask features 2203 includes a first thickness (T1) measured from a top surface of the fin 204.

Figure 8:
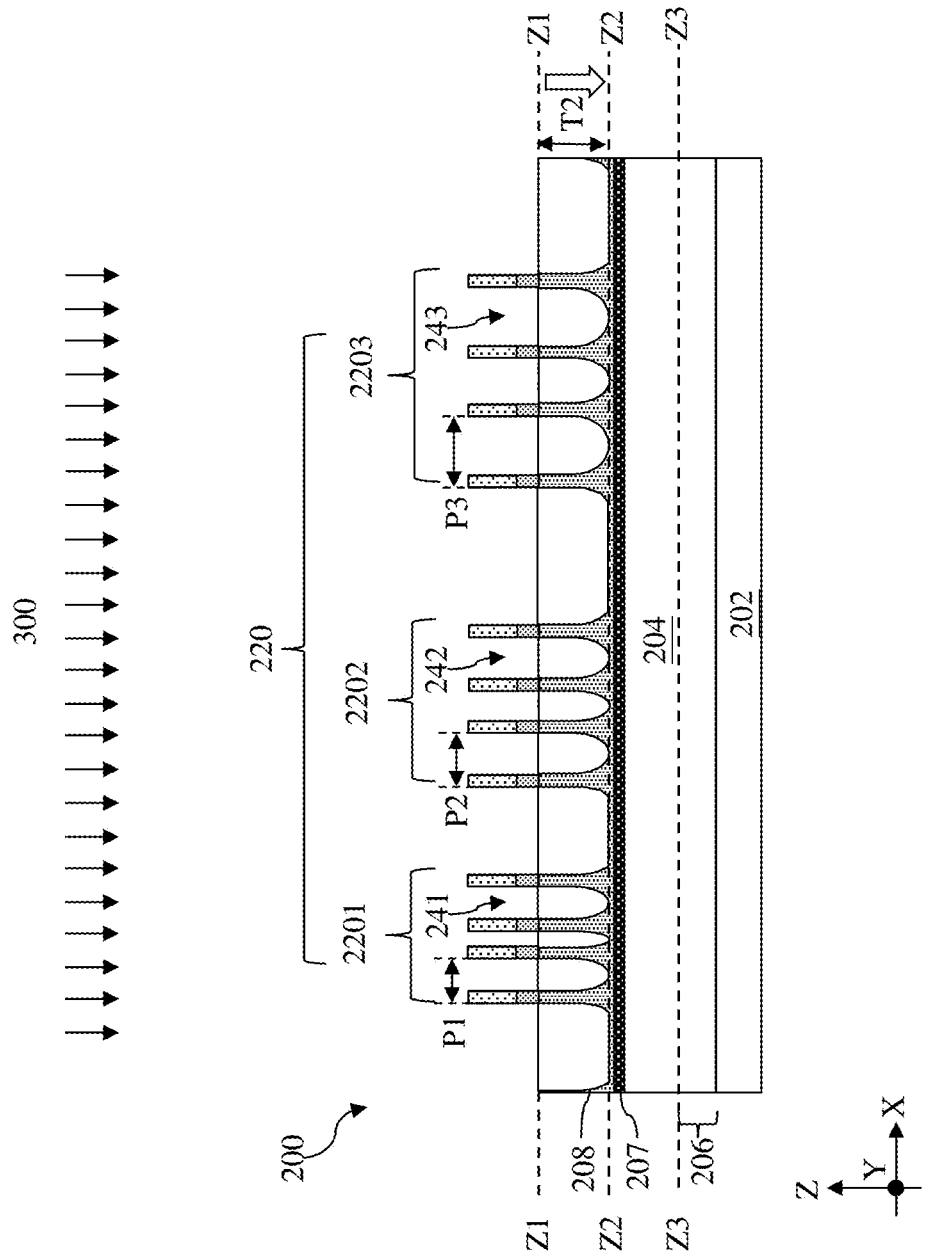

Referring to FIGS. 1 and 8, method 100 includes a block 114 where a first etch process 300 is performed using the patterned hard mask 220 as an etch mask. In some embodiments, the first etch process 300 is a main etch process that etches in a top-down manner from a top surface level Z1 of the gate material layer 208 through a second thickness T2 to a level Z2. In some instances, the second thickness T2 is about 90% and about 95% of the first thickness T1. That is, upon conclusion of the first etch process 300, a finite or measurable amount of gate material layer remains over top surfaces of the plurality of fins 204. To readily remove byproduct of the first etch process 300 of the gate material layer 208, the first etch process includes a dry etch process that uses carbon tetrafluoride ($CF_4$) as an etchant. In conventional processes, use of carbon tetrafluoride ($CF_4$) in the main etch process is not favored as it can result in strong lateral etching that may prematurely thin top portions of the gate structures (230, shown in FIG. 11). According to the present disclosure, the pressure of the first etch process 300 is increased from less than 20 mTorr in the conventional process to between about 40 mTorr and about 100 mTorr. It is observed that the increased process pressure of the third etch process 500 reduces the mean free path of carbon tetrafluoride, thereby easing the lateral etching associated with use of carbon tetrafluoride. The disclosed pressure range (i.e., between about 40 mTorr and about 100 mTorr) is selected such that pressure of the first etch process 300 is at least twice of the conventional pressure range to ensure detectable differences in etching characteristics. At the same time, this pressure range is selected such that pressure of the first etch process 300 does not unduly reduce the mean free path to overly decrease etch rates. The increased process pressure at block 114 requires increased energy to ignite a plasma. In some embodiments, the first etch process 300 and the first etch process 300 may include use of inductively coupled plasma (ICP) powered in the range between about 400 W and about 3500 W or use of capacitively coupled plasma (CCP) powered in the range between about 500 W and about 5500 W. When the ICP or CCP power level falls below the disclosed ranges, the etch rate may be unduly reduced and the process time may increase. Increased process time would lead to increase in production cost. When the ICP or CCP power level rises above the disclosed ranges, the etch rate may be unduly increased and the desired etch characteristics may be lost, leading to undesirable fin sidewall profiles.

Figure 11:
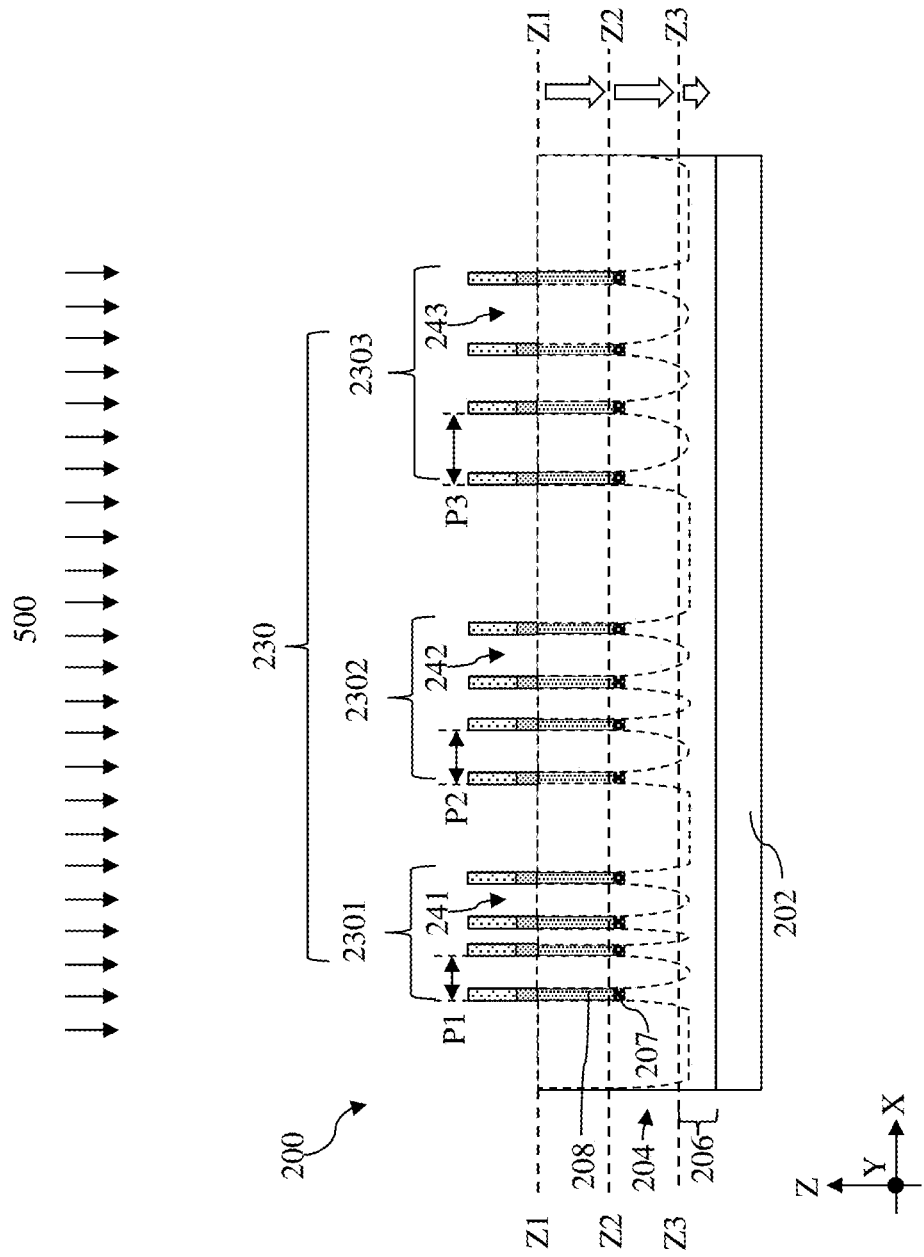

While lateral etching may be a concern for the first etch process 300, the first etch process 300 is free of use of oxygen gas ($O_2$), which is known to generate more byproducts for passivating sidewalls of the gate structures 230 (shown in FIG. 11). In some implementations, besides carbon tetrafluoride ($CF_4$), the first etch process 300 may further include hydrogen bromide (HBr) and chlorine ($Cl_2$). In some instances, the first etch process 300 includes hydrogen bromide at 200 sccm (standard cubic centimeter per minute) and carbon tetrafluoride at about 20 sccm to 50 sccm. As illustrated in FIG. 8, the first etch process at block 114 form a first trench 241 defined between two of the first plurality of hard mask features 2201, a second trench 242 defined between two of the second plurality of hard mask features 2202, and a third trench 243 defined between two of the third plurality of hard mask features 2203. Each of the first trench 241, the second trench 242, and the third trench 243 has a depth that is substantially equal to the second thickness T2. As described above, the second thickness T2 is about 90% to about 95% of the first thickness T1.

Figure 9:
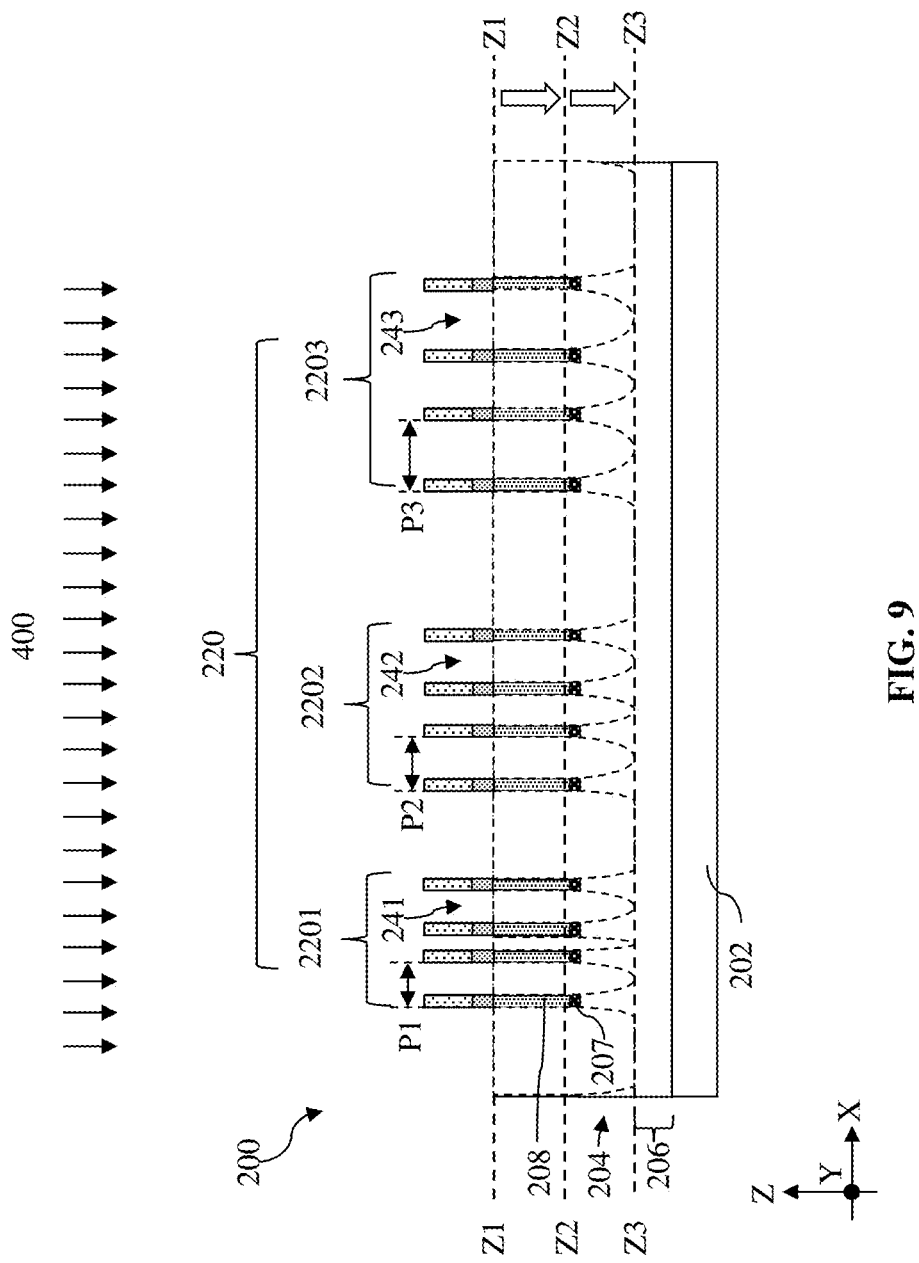
Figure 10:
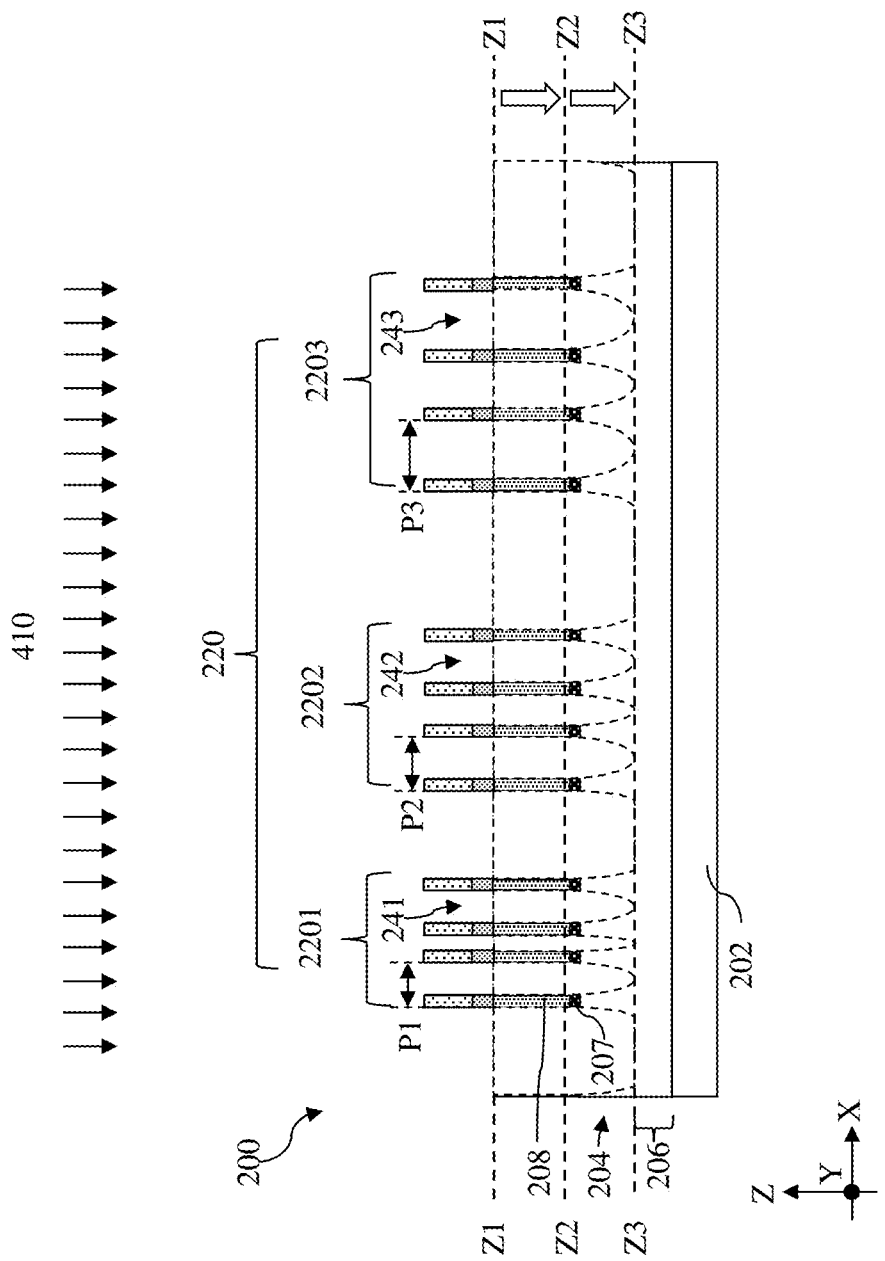

Referring to FIGS. 1, 9 and 10, method 100 includes a block 116 where a second etch process 400 is performed using the patterned hard mask 220 as an etch mask. Reference is first made to FIG. 9. In some embodiments, the second etch process 400 is a soft-landing etch process that etches in a top-down manner from the level Z2 to a level Z3 at the top surface of the isolation feature 206. Different from the first etch process 300, the second etch process 400 is free of carbon tetrafluoride and includes oxygen gas ($O_2$) to enhance lateral passivation. In some implementations, the second etch process 400 may include use of chlorine ($Cl_2$), oxygen gas ($O_2$), and hydrogen bromide (HBr). In some instances, the process pressure for the second etch process 400 is also between about 40 Millitorr (mTorr) and about 100 mTorr, for reasons similar to those described above with respect to block 114. As shown in FIG. 9, the second etch process 400 extends the first trench 241, the second trench 242 and the third trench 243 to level Z3 (i.e., the top surface of the isolation feature 206).

Reference is now made to FIG. 10. In some embodiments, in order to prevent unintended damages to the plurality of fins 204, the second etch process 400 may optionally include a nitridation process 410 that includes introduction of a nitrogen containing reagent, such as nitrogen gas ($N_2$) or ammonia ($NH_3$), to nitridate the dummy gate dielectric layer 207. In instances where the dummy gate dielectric layer 207 is formed of silicon oxide, the nitridation process 410 may introduce nitrogen into the dummy gate dielectric layer 207 such that at least an outer portion of the dummy gate dielectric layer 207 is formed of silicon oxynitride (SiON). Because silicon oxynitride etches at a rate slower than silicon oxide does during the second etch process 400, the nitridation process 410 may protect the fin 204 from damages due to the second etch process 400. The nitridation process 410 may be incorporated into the second etch process 400. In that regard, the second etch process 400 may include an etching cycle (i.e., use of the etchants described above, such as chlorine, hydrogen bromide and oxygen gas) and a nitridation cycle (i.e., the nitridation process 410). In an example, the second etch process 400 may commence with an etching cycle, followed by a nitridation cycle, which is again followed by another etching cycle. Other arrangements of the etching cycle and the nitridation cycle are fully contemplated.

Referring to FIGS. 1 and 11, method 100 includes a block 118 where a third etch process 500 is performed using the patterned hard mask 220 as an etch mask. In some embodiments, the third etch process 500 is an over-etching process that etches in a top-down manner into the top surface of the isolation feature 206. That is, the third etch process 500 further extends the first trench 241, the second trench 242 and the third trench 243 at least partially into the isolation feature 206. Upon conclusion of the operations at block 118, gate structures 230 are substantially formed. As shown in FIG. 11, the gate structures 230 includes the first plurality of gate structures 2301 that include the first pitch P1, the second plurality of gate structures 2302 that include the second pitch P2, and the third plurality of gate structures 2303 that include the third pitch P3. According to the present disclosure, the purpose of the third etch process 500 is to laterally etch the sidewalls toward the bottom of the first trench 241, the second trench 242 and the third trench 243. In some embodiments, the third etch process 500 includes use of chlorine ($Cl_2$) supplied at between about 200 sccm and about 500 sccm. To prevent unintended damages to the portion of the gate structures 230 that have already been formed in the first etch process 300 and the second etch process 400, the third etch process 500 may last between about 10 seconds to about 20 seconds. In some implementations, the third etch process 500 does not include use of hydrogen bromide (HBr) and oxygen gas ($O_2$). The former has an etch rate smaller than chlorine and the latter functions to enhance lateral passivation. In some instances, the third etch process 500 is also performed at a pressure between about 40 mTorr and about 100 mTorr, for reasons similar to those described above with respect to block 114. As described above, this increased pressure range may reduce mean free path of the etchant and may reduce the etching rate.

Referring to FIG. 1, method 100 includes a block 120 where further processes are performed. Such further processes may include deposition of gate spacers over the gate structures 230, deposition of an interlayer dielectric (ILD) layer over the workpiece 200, formation of source/drain trenches adjacent to the gate structures 230, formation of source/drain epitaxial features, deposition of another interlayer dielectric (ILD) layer, replacement of the gate stacks with functional gate structures, formation of source/drain contacts to the source/drain epitaxial features, and formation of gate contacts to the functional gate structures. Because the functional gate structures replace the gate structures 230, they substantially inherit the shapes, dimensions, and pitches of the gate structures 230. Upon conclusion of method 100, the functional gate structure of the semiconductor device 200 includes a first plurality of functional gate structures that replace the first plurality of gate structures 2301, a second plurality of functional gate structures that replace the second plurality of gate structures 2302, and a third plurality of functional gate structures that replace the third plurality of gate structures 2303. As a result, the first plurality of functional gate structures may have the first pitch P1, the second plurality of functional gate structures may have the second pitch P2, and the third plurality of functional gate structures may have the third pitch P3.

Processes of the present disclosure provide benefits. An example of processes of the present disclosure includes a first etch process, a second etch process, and a third etch process. The first etch process is a main etch process that etches through a substantial portion of the depth of the gate material layer over the fins to form a trench. The first etch process includes use of carbon tetrachloride ($CF_4$) for ready removal of byproducts and an increased pressure to reduce lateral etching. The first etch process does not include use of oxygen gas that may cause more byproducts redeposition. The second etch process is a soft-landing etch process that extends the trench to a top surface of the isolation feature. The second etch process includes use of oxygen and may include a nitridation process to protect the fins from damages. The third etch process is an over-etch process that extends the trench partially into the isolation feature. The third etch process includes use of chlorine ($Cl_2$) and a short etch duration. Processes of the present disclosure may be use to etch through a gate material layer to form differently-pitched gate structures without additional photolithography steps.

In one aspect, the present disclosure provides a method. The method includes providing a workpiece including a substrate and a plurality of semiconductor fins over the substrate, where each of the plurality of semiconductor fins is spaced apart from another of the plurality of semiconductor fins by an isolation feature, depositing a gate material layer over the workpiece, where the gate material layer includes a first thickness over a top surface of the plurality of semiconductor fins, forming a patterned hard mask over the gate material layer, where the patterned hard mask includes a first plurality of elongated features and a second plurality of elongated features, performing a first etch process using the patterned hard mask as an etch mask through the gate material layer to form a trench that extends through about 90% and about 95% of the first thickness toward the top surface of the plurality of semiconductor fins, performing a second etch process using the patterned hard mask as an etch mask to extend the trench to a top surface of the isolation feature, and performing a third etch process using the patterned hard mask to extend the trench into the isolation feature. The first plurality of elongated features includes a first pitch and the second plurality of elongated features includes a second pitch greater than the first pitch. The first etch process includes use of carbon tetrafluoride and a pressure between about 40 mTorr and about 100 mTorr and the first etch process is free of use of oxygen gas.

In some embodiments, the first etch process further includes use of hydrogen bromide and chlorine. In some implementations, a ratio of the second pitch to the first pitch is between about 1.1 and about 2.0. In some instances, the second etch process includes a dry etch process using chlorine, hydrogen bromide, or oxygen gas. In some implementations, the second etch process includes a nitridation process that uses a nitrogen containing reagent. In some embodiments, the nitrogen containing reagent includes nitrogen gas ($N_2$). In some embodiments, the third etch process includes chlorine. In some implementations, the third etch process is free of use of oxygen gas and hydrogen bromide.

In another aspect, the present disclosure provides a method. The method includes providing a workpiece that includes a substrate, a plurality of semiconductor fins over the substrate, each of the plurality of semiconductor fins spaced apart from another of the plurality of semiconductor fins by an isolation feature, and a dielectric layer disposed conformally over the plurality of semiconductor fins, depositing a gate material layer over the workpiece, where the gate material layer includes a first thickness over a top surface of the plurality of semiconductor fins, forming a patterned hard mask over the gate material layer, where the patterned hard mask includes a first plurality of elongated features and a second plurality of elongated features, performing a first etch process using the patterned hard mask as an etch mask to form a trench that extends through a substantial portion of the first thickness, performing a second etch process using the patterned hard mask as an etch mask to extend the trench to a top surface of the isolation feature, and performing a third etch process using the patterned hard mask to extend the trench into the isolation feature. The first plurality of elongated features includes a first pitch and the second plurality of elongated features includes a second pitch greater than the first pitch. The first etch process and the third etch process are free of use of oxygen gas and the second etch process includes use of oxygen gas.

In some embodiments, the first etch process includes use of hydrogen bromide, carbon tetrafluoride and chlorine. In some implementations, the first etch process includes a pressure between about 40 mTorr and about 100 mTorr. In some instances, a ratio of the second pitch to the first pitch is between about 1.1 and about 2.0. In some embodiments, the second etch process includes a dry etch process using chlorine, hydrogen bromide, or oxygen gas. In some implementations, the third etch process includes chlorine. In some embodiments, the second etch process includes a nitridation process to introduce nitrogen into the dielectric layer. In some instances, the nitridation process includes use of nitrogen gas ($N_2$).

In yet another aspect, the present disclosure provides a method. The method includes providing a workpiece that includes a substrate, a plurality of semiconductor fins over the substrate, each of the plurality of semiconductor fins spaced apart from another of the plurality of semiconductor fins by an isolation feature, and a silicon oxide layer disposed conformally over the plurality of semiconductor fins, depositing a gate material layer over the workpiece, where the gate material layer includes a first thickness over a top surface of the plurality of semiconductor fins, forming a patterned hard mask over the gate material layer, where the patterned hard mask includes a first plurality of elongated features and a second plurality of elongated features, performing a first etch process using the patterned hard mask as an etch mask to form a trench that extends through a substantial portion of the first thickness, performing a second etch process using the patterned hard mask as an etch mask to extend the trench to a top surface of the isolation feature, and performing a third etch process using the patterned hard mask to extend the trench into the isolation feature. The first plurality of elongated features includes a first pitch and the second plurality of elongated features includes a second pitch that is about 1.1 times to about 2 times of the first pitch. The first etch process includes carbon tetrafluoride and is free of use of oxygen gas. The third etch process is free of use of oxygen gas and hydrogen bromide and includes chlorine.

In some implementations, the first etch process further includes use of hydrogen bromide and chlorine. In some embodiments, the first etch process includes a pressure between about 40 mTorr and about 100 mTorr. In some instances, the second etch process includes a nitridation process to convert a portion of the silicon oxide layer into silicon oxynitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a workpiece comprising a substrate and a plurality of semiconductor fins over the substrate, each of the plurality of semiconductor fins spaced apart from another of the plurality of semiconductor fins by an isolation feature;
depositing a gate material layer over the workpiece, the gate material layer comprising a first thickness over a top surface of the plurality of semiconductor fins;
forming a patterned hard mask over the gate material layer, the patterned hard mask including a first plurality of elongated features and a second plurality of elongated features;
performing a first etch process using the patterned hard mask as an etch mask through the gate material layer to form a trench that extends through about 90% and about 95% of the first thickness toward the top surface of the plurality of semiconductor fins;
performing a second etch process using the patterned hard mask as an etch mask to extend the trench to a top surface of the isolation feature; and
performing a third etch process using the patterned hard mask to extend the trench into the isolation feature,
wherein the first plurality of elongated features includes a first pitch and the second plurality of elongated features includes a second pitch greater than the first pitch,
wherein the first etch process comprises use of carbon tetrafluoride and a pressure between about 40 mTorr and about 100 mTorr,
wherein the first etch process is free of use of oxygen gas,
wherein the second etch process comprises a nitridation process that uses a nitrogen containing reagent.

2. The method of claim 1, wherein the first etch process further comprises use of hydrogen bromide and chlorine.

3. The method of claim 1, wherein a ratio of the second pitch to the first pitch is between about 1.1 and about 2.0.

4. The method of claim 1, wherein the second etch process comprises a dry etch process using chlorine, hydrogen bromide, or oxygen gas.

5. The method of claim 1, further comprising:
prior to the depositing of the gate material layer, depositing a dummy gate dielectric layer,
wherein the dummy gate dielectric layer comprises silicon oxide,
wherein the nitridation process converts an exposed portion of the dummy gate dielectric layer into silicon oxynitride.

6. The method of claim 1, wherein the nitrogen containing reagent comprise nitrogen gas ($N_2$).

7. The method of claim 1, wherein the third etch process comprises chlorine.

8. The method of claim 7, wherein the third etch process is free of use of oxygen gas and hydrogen bromide.

9. A method, comprising:
providing a workpiece comprising:
a substrate,
a plurality of semiconductor fins over the substrate, each of the plurality of semiconductor fins spaced apart from another of the plurality of semiconductor fins by an isolation feature, and
a dielectric layer disposed conformally over the plurality of semiconductor fins;
depositing a gate material layer over the workpiece, the gate material layer comprising a first thickness over a top surface of the plurality of semiconductor fins;
forming a patterned hard mask over the gate material layer, the patterned hard mask including a first plurality of elongated features and a second plurality of elongated features;
performing a first etch process using the patterned hard mask as an etch mask to form a trench that extends through a substantial portion of the first thickness;
performing a second etch process using the patterned hard mask as an etch mask to extend the trench to a top surface of the isolation feature; and
performing a third etch process using the patterned hard mask to extend the trench into the isolation feature,
wherein the first plurality of elongated features includes a first pitch and the second plurality of elongated features includes a second pitch greater than the first pitch,
wherein the first etch process and the third etch process are free of use of oxygen gas and the second etch process comprises use of oxygen gas,
wherein the second etch process comprises a nitridation process to introduce nitrogen into the dielectric layer.

10. The method of claim 9, wherein the first etch process comprises use of hydrogen bromide, carbon tetrafluoride and chlorine.

11. The method of claim 9, wherein the first etch process comprises a pressure between about 40 mTorr and about 100 mTorr.

12. The method of claim 9, wherein a ratio of the second pitch to the first pitch is between about 1.1 and about 2.0.

13. The method of claim 9, wherein the second etch process comprises a dry etch process using chlorine, hydrogen bromide, or oxygen gas.

14. The method of claim 9, wherein the third etch process comprises chlorine.

15. The method of claim 9, wherein the dielectric layer comprises silicon oxide before the nitridation process.

16. The method of claim 9, wherein the nitridation process comprises use of nitrogen gas ($N_2$).

17. A method, comprising:
providing a workpiece comprising:
a substrate,
a plurality of semiconductor fins over the substrate, each of the plurality of semiconductor fins spaced apart from another of the plurality of semiconductor fins by an isolation feature, and
a silicon oxide layer disposed conformally over the plurality of semiconductor fins;
depositing a gate material layer over the workpiece, the gate material layer comprising a first thickness over a top surface of the plurality of semiconductor fins;
forming a patterned hard mask over the gate material layer, the patterned hard mask including a first plurality of elongated features and a second plurality of elongated features;
performing a first etch process using the patterned hard mask as an etch mask to form a trench that extends through a substantial portion of the first thickness;
performing a second etch process using the patterned hard mask as the etch mask to extend the trench to a top surface of the isolation feature; and
performing a third etch process using the patterned hard mask to extend the trench into the isolation feature,
wherein the first plurality of elongated features includes a first pitch and the second plurality of elongated features includes a second pitch that is about 1.1 times to about 2 times of the first pitch,
wherein the first etch process comprises carbon tetrafluoride and is free of use of oxygen gas,
wherein the third etch process is free of use of oxygen gas and hydrogen bromide and comprises chlorine,
wherein the second etch process comprises a nitridation process to convert a portion of the silicon oxide layer into silicon oxynitride.

18. The method of claim 17, wherein the first etch process further comprises use of hydrogen bromide and chlorine.

19. The method of claim 18, wherein the first etch process comprises a pressure between about 40 mTorr and about 100 mTorr.

20. The method of claim 17, wherein the second etch process comprises a plurality of nitridation process cycles and a plurality of etching cycles.

* * * * *